(12) United States Patent
Hiraoka et al.

(10) Patent No.: US 9,571,094 B2
(45) Date of Patent: Feb. 14, 2017

(54) SWITCH CIRCUIT

(71) Applicant: Seiko Instruments Inc., Chiba-shi, Chiba (JP)

(72) Inventors: Naohiro Hiraoka, Chiba (JP); Tomohiro Oka, Chiba (JP)

(73) Assignee: SII Semiconductor Corporation, Chiba (JP)

( * ) Notice: Subject to any disclaimer, the term of this patent is extended or adjusted under 35 U.S.C. 154(b) by 0 days.

(21) Appl. No.: 15/002,693

(22) Filed: Jan. 21, 2016

(65) Prior Publication Data
US 2016/0218710 A1 Jul. 28, 2016

(30) Foreign Application Priority Data

Jan. 23, 2015 (JP) ................. 2015-011546

(51) Int. Cl.
| | | |
|---|---|---|
| H03K 5/08 | (2006.01) | |
| H03K 17/687 | (2006.01) | |
| H03K 17/06 | (2006.01) | |
| H03K 17/0812 | (2006.01) | |
| H03K 17/16 | (2006.01) | |

(52) U.S. Cl.
CPC ............ *H03K 17/6871* (2013.01); *H03K 5/08* (2013.01); *H03K 17/063* (2013.01); *H03K 17/08122* (2013.01); *H03K 17/162* (2013.01); *H03K 2217/0054* (2013.01); *H03K 2217/0081* (2013.01)

(58) Field of Classification Search
CPC .... H03K 5/08; H03K 5/1252; H03M 2201/64; H03M 3/344
USPC .................. 327/309–330, 419, 427, 430–437
See application file for complete search history.

(56) References Cited

U.S. PATENT DOCUMENTS 4,985,703 A * 1/1991 Kaneyama ........... H03K 17/693
                                              327/408
5,898,335 A * 4/1999 Miyamoto .............. G05F 3/242
                                              327/311

* cited by examiner

*Primary Examiner* — Lincoln Donovan
*Assistant Examiner* — Diana J Cheng
(74) *Attorney, Agent, or Firm* — Brinks Gilson & Lione

(57) ABSTRACT

To provide a switch circuit which is capable of reliably controlling transmission of a voltage from GND to VDD to an internal circuit or shut-off thereof even when a positive or negative voltage is inputted to an input terminal, and thereby reduces the risk of latch-up. A switch circuit is comprised of NMOS transistors, and the gates of the NMOS transistors are controlled by an output voltage of a boosting circuit, thereby making it possible to reliably control transmission or shut-off of a voltage from GND to VDD.

2 Claims, 4 Drawing Sheets

SWITCH CIRCUIT

RELATED APPLICATIONS

This application claims priority under 35 U.S.C. §119 to Japanese Patent Application No. 2015-011546 filed on Jan. 23, 2015, the entire content of which is hereby incorporated by reference.

BACKGROUND OF THE INVENTION

Field of the Invention

The present invention relates to a switch circuit provided at a terminal at which a positive or negative voltage is inputted to an internal circuit of a semiconductor device.

Background Art

FIG. 4 is a circuit diagram showing a related art switch circuit. The switch circuit controls whether to transmit a positive or negative voltage inputted to an input terminal IN to an internal circuit 15 or shut off the positive or negative voltage, according to a signal of a switch control terminal EN.

Consider where the positive voltage VIN+ inputted from the input terminal IN is caused to be transmitted to a node B which is an input terminal of the internal circuit 15. The signal of the switch control terminal EN is made to be a VDD voltage in an active state to turn ON NMOS transistors 11 and 12. Here, the VDD voltage is a power supply voltage of the internal circuit 15. Further, a level shifter circuit 18 is configured to convert the signal of the input terminal LI into a voltage by the voltage of a power supply terminal LV and output the voltage from an output terminal LO and thereby to reverse the logic of the input and output. When the signal of the input terminal LI is of the VDD voltage, the level shifter circuit 18 outputs a signal of a GND voltage from the output terminal LO.

When the signal of the input terminal LI is of the GND voltage, the level shifter circuit 18 outputs a signal of the voltage of the power supply terminal LV from the output terminal LO. Thus, the level shifter circuit 18 outputs the GND voltage. When the voltage VIN+ is a voltage less than or equal to (|VGSP1|+|VOVP1|), the level shifter circuit 18 turns OFF a PMOS transistor 16. When the voltage VIN+ is a voltage greater than or equal to (|VGSP1|+|VOVP1|), the level shifter circuit 18 turns ON the PMOS transistor 16. Here, VGSP1 is a threshold voltage (VGSP1<0V) of each of the PMOS transistors 16 and a PMOS transistor 17. VOVP1 is an overdrive voltage (VOVP1<0V) necessary to reliably turn ON the PMOS transistors 16 and 17. Further, since the signal of the switch control terminal EN becomes the GND voltage through an inverter 14, the PMOS transistor 17 is turned ON. Thus, the positive voltage VIN+ inputted from the input terminal IN is transmitted to the node B which is the input terminal of the internal circuit 15. At this time, since an NMOS transistor 13 is being turned OFF, it does not affect the voltage of the node B.

Further, since the voltage at which the voltage VIN+ is greater than or equal to the GND voltage and less than or equal to (|VGSP1|+|VOVP1|) can be transmitted to the node B through the NMOS transistors 11 and 12, the voltage at which the voltage VIN+ is greater than or equal to (|VGSP1|+|VOVP1|) and less than or equal to (VDD-VGSN1-VOVN1) can be transmitted to the node B through either the NMOS transistors 11 and 12 or the PMOS transistors 16 and 17, and the voltage at which the voltage VIN+ is greater than or equal to (VDD-VGSN1-VOVN1) and less than or equal to VDD can be transmitted to the node B through the PMOS transistors 16 and 17, the positive voltage VIN+ inputted from the input terminal IN can be transmitted to the node B between the GND voltage at minimum and the VDD voltage at maximum.

Here, VDD is a power supply voltage, VGSN1 is a threshold voltage (VGSN1>0V) of each of the NMOS transistors 11 and 12, and VOVN1 is an overdrive voltage (VOVN>0V) necessary to reliably turn ON the NMOS transistors 11 and 12.

Next, consider where the positive voltage VIN+ inputted from the input terminal IN is not caused to be transmitted to the node B taken as the input of the internal circuit 15. The signal of the switch control terminal EN is made to be a GND voltage in an inactive state. Since the GND voltage is inputted to the input terminal LI, the level shifter circuit 18 outputs the same voltage as VIN+ connected to the power supply terminal LV from the output terminal LO. Since a gate of the NMOS transistor 13 is at the VDD voltage and a source thereof is at the GND voltage, the NMOS transistor 13 is turned ON to bring a node A to the GND voltage. Since a gate and a source (node A) of the NMOS transistor 11 are at the GND voltage, the NMOS transistor 11 is turned OFF. Since a gate and a drain (node A) of the NMOS transistor 12 are at the GND voltage, the NMOS transistor 12 is turned OFF. Since a gate and a source (input terminal IN) of the PMOS transistor 16 are at the voltage VIN+, the PMOS transistor 16 is turned OFF. Since a gate of the PMOS transistor 17 is at the VDD voltage and a drain (node B) thereof is less than or equal to the VDD voltage, the PMOS transistor 17 is turned OFF. Thus, the positive voltage VIN+ inputted from the input terminal IN is not transmitted to the node B taken as the input of the internal circuit 15.

Next, consider where the negative voltage VIN- inputted from the input terminal IN is not caused to be transmitted to the node B taken as the input of the internal circuit 15. The signal of the switch control terminal EN is made to be the GND voltage in the inactive state. Since, however, the negative voltage VIN- lower than the GND voltage is applied to the input terminal IN, the NMOS transistor 11 is brought into an ON state in a weak inversion region. Here, since the NMOS transistor 13 is turned ON, the node A is not brought to the input negative voltage VIN-, but to the GND voltage. Since the gate and source of the NMOS transistor 12 are at the GND voltage, the NMOS transistor 12 is turned OFF. Since VIN- is applied to the gate, source and backgate of the PMOS transistor 16, the PMOS transistor 16 is turned OFF. Since the gate of the PMOS transistor 17 is at the VDD voltage and the node B is at less than or equal to the VDD voltage, the PMOS transistor 17 is turned OFF. Thus, the negative voltage VIN- inputted from the input terminal IN is not transmitted to the node B taken as the input of the internal circuit 15.

Thus, the related art switch circuit is capable of preventing the negative voltage from being transmitted to the input of the internal circuit 15 even if the negative voltage is inputted from the input terminal IN, and preventing the malfunction of the internal circuit.

[Patent Document 1] Japanese Patent Application Laid-Open No. 2013-183206

SUMMARY OF THE INVENTION

In the related art switch circuit, however, there is a possibility that the risk of causing latch-up will exist since the PMOS transistor 16 the source and backgate of which are connected to the input terminal IN, and the NMOS transistor 13 the source and backgate of which are connected to the GND terminal exist in close proximity to each other on a circuit basis, and that a large current is made to flow to thereby break down the circuit. Further, when a countermeasure is taken against the latch-up in layout design, a circuit scale is increased, thus leading to the cost-up of a product.

A switch circuit of the present invention has been made to solve the above problems. The switch circuit is configured such that it is equipped with a first NMOS transistor having a drain connected to an input terminal of a semiconductor device, a source connected to a first node, and a gate connected to a second node, a second NMOS transistor having a drain connected to the first node, a source connected to a third node, and a gate connected to the second node, a third NMOS transistor having a drain connected to the first node, and a gate connected to a switch control terminal via an inverter, and a boosting circuit having a boosting circuit control terminal connected to the switch control terminal, a voltage input terminal connected to a power supply, and a voltage output terminal connected to the second node, and the third node is connected to an internal circuit.

According to the switch circuit of the present invention, it is possible to prevent the transmission of a negative voltage inputted from an input terminal to an input terminal of an internal circuit even if the negative voltage is inputted therefrom and transmit a voltage up to a VDD voltage as a positive voltage to the input of the internal circuit, and to reduce a risk caused by latch-up.

DETAILED DESCRIPTION OF THE PREFERRED EMBODIMENTS

Embodiments of a switch circuit of the present invention will hereinafter be described with reference to the accompanying drawings. The switch circuit controls whether to transmit a positive or negative voltage inputted to an input terminal IN to an internal circuit 15 or shut off the positive or negative voltage, according to a signal of a switch control terminal EN.

First Embodiment

Figure 1:
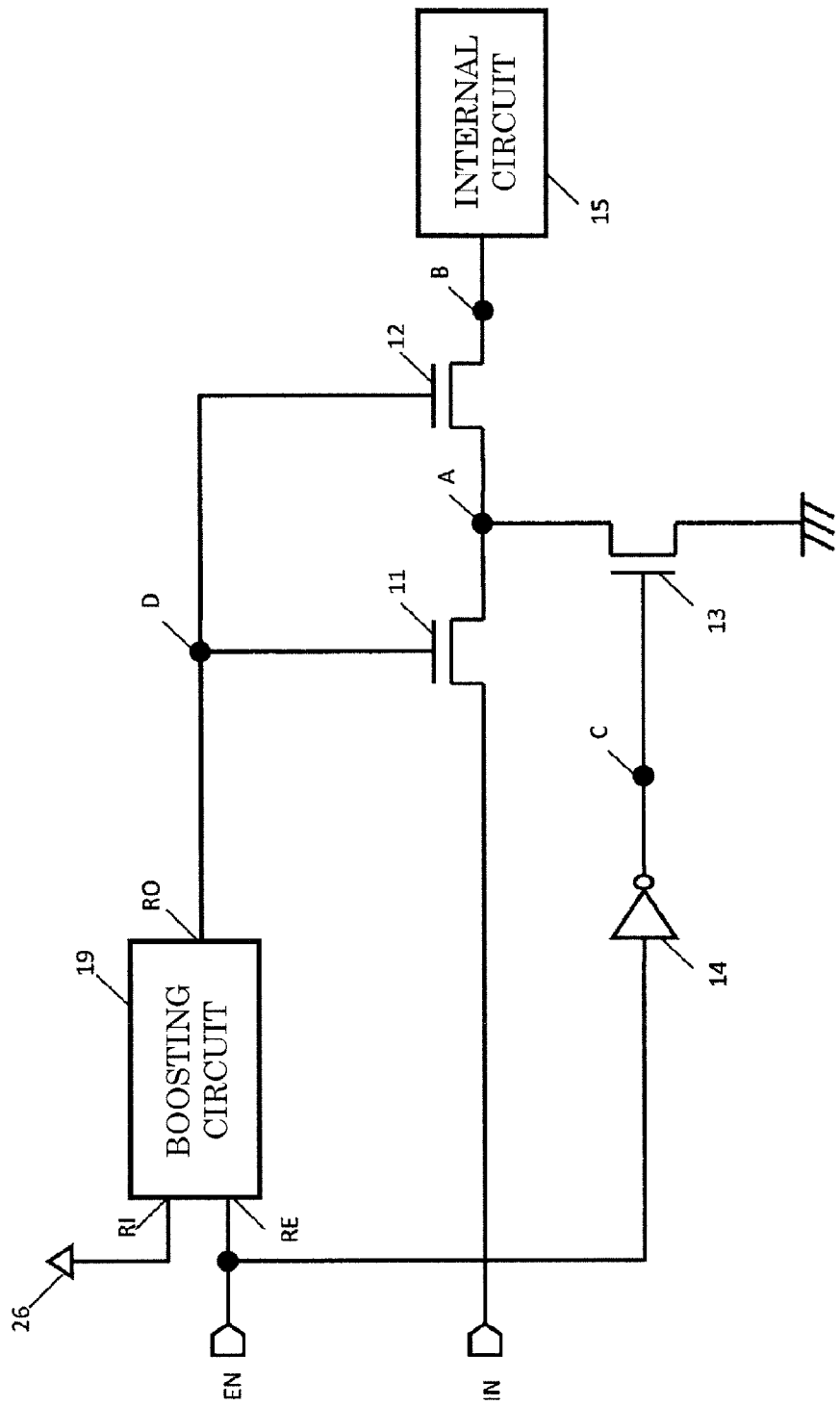
FIG. 1 is a circuit diagram illustrating a switch circuit according to a first embodiment.

FIG. 1 is a circuit diagram illustrating a switch circuit according to a first embodiment.

The switch circuit according to the first embodiment is equipped with NMOS transistors 11, 12 and 13, an inverter 14, and a boosting circuit 19.

The NMOS transistor 11 has a drain connected to the input terminal IN, a gate connected to a voltage output terminal RO (node D) of the boosting circuit 19, and a source connected to a drain of the NMOS transistor 12 and a drain of the NMOS transistor 13. The NMOS transistor 12 has a gate connected to the voltage output terminal RO (node D) of the boosting circuit 19, and a source connected to an input terminal (node B) of the internal circuit 15. The NMOS transistor 13 has the drain connected to the source of the NMOS transistor 11 and the drain of the NMOS transistor 12, a gate connected to an output terminal (node C) of the inverter 14, and a source grounded to GND. The inverter 14 has an input terminal connected to the switch control terminal EN. The boosting circuit 19 has a boosting circuit control terminal RE connected to the switch control terminal EN, and a voltage input terminal RI connected to a power supply voltage 26.

The boosting circuit 19 is controlled to be ON/OFF according to the signal of the switch control terminal EN. In an ON state, the boosting circuit 19 outputs a voltage obtained by boosting a signal inputted to the voltage input terminal RI from the voltage output terminal RO. In an OFF state, the boosting circuit 19 outputs a GND voltage from the voltage output terminal RO. The NMOS transistors 11 and 12 are controlled to be ON/OFF by the signal of the voltage output terminal RO of the boosting circuit 19. The inverter 14 inverts a signal of a VDD/GND voltage inputted thereto and outputs the inverted signal. The NMOS transistor 13 is controlled to be ON when the NMOS transistors 11 and 12 are turned OFF.

The operation of the switch circuit according to the first embodiment will next be described.

(1) When a positive voltage VIN+ inputted from the input terminal IN is not caused to be transmitted to the node B:

The switch control terminal EN is inputted with a signal of a GND voltage in an inactive state. Since the gate of the NMOS transistor 13 is at the VDD voltage and the source thereof is at the GND voltage, the NMOS transistor 13 is turned ON to bring a node A to the GND voltage. Since the gate and source (node A) of the NMOS transistor 11 are at the GND voltage, the NMOS transistor 11 is turned OFF. Since the gate and drain (node A) of the NMOS transistor 12 are at the GND voltage, the NMOS transistor 12 is turned OFF. Thus, the positive voltage VIN+ inputted from the input terminal IN is not transmitted to the node B.

(2) When a negative voltage VIN− inputted from the input terminal IN is not caused to be transmitted to the node B:

The switch control terminal EN is inputted with the signal of the GND voltage in the inactive state. The boosting circuit 19 is brought into an OFF state and thereby outputs the GND voltage. Since the drain of the NMOS transistor 11 is at the negative voltage VIN− and the gate thereof is at the GND voltage, the NMOS transistor 11 is brought into an ON state in a weak inversion region. Since, however, the gate of the NMOS transistor 13 is at the VDD voltage, the NMOS transistor 13 is turned ON to bring the node A to the GND voltage. Since the drain and gate of the NMOS transistor 12 are at the GND voltage, the NMOS transistor 12 is turned OFF. Thus, the negative voltage VIN− inputted from the input terminal IN is not transmitted to the node B.

(3) When the positive voltage VIN+ (less than or equal to VDD voltage) inputted from the input terminal IN is caused to be transmitted to the node B:

The switch control terminal EN is inputted with a signal of a VDD voltage in an active state. The boosting circuit 19 is brought into an ON state and thereby outputs a boosted voltage greater than or equal to (VDD+VGSN1+VOVN1). Since the gate of the NMOS transistor 11 is at the voltage greater than or equal to (VDD+VGSN1+VOVN1), the NMOS transistor 11 transmits the voltage VIN+ to the source (node A). The NMOS transistor 12 also similarly propagates the voltage VIN+ to the node B.

As describe above, the switch circuit according to the present embodiment is capable of transmitting the input voltage which ranges from the GND voltage to the VDD voltage.

Further, the switch circuit according to the present embodiment has no risk of latch-up because there are not provided PMOS transistors each having a source and a backgate connected to a power supply or a node such as an input/output terminal into which a large current is made to flow.

Figure 2:
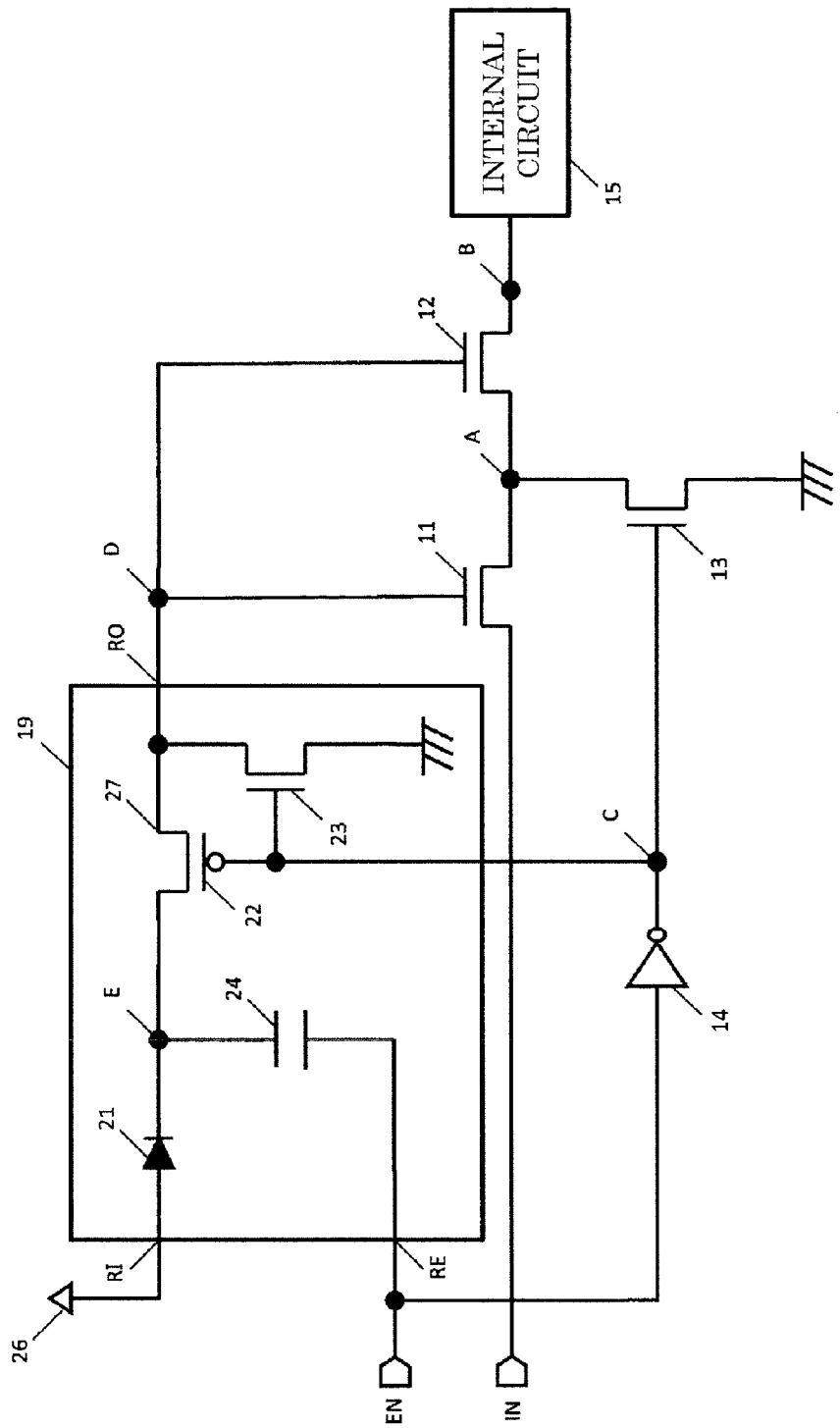
FIG. 2 is a circuit diagram illustrating one example of a boosting circuit in the first embodiment.

FIG. 2 is one example of the configuration of the boosting circuit 19 employed in the first embodiment. A diode 21 has an anode connected to the voltage input terminal RI (power supply 26) and a cathode connected to one end (node E) of a capacitor 24. A PMOS transistor 22 has a drain connected to the voltage output terminal RO (node D) of the boosting circuit 19, a gate connected to the output terminal (node C) of the inverter 14, and a source connected to one end (node E) of the capacitor 24. An NMOS transistor 23 has a drain connected to the voltage output terminal RO (node D) of the boosting circuit 19, a gate connected the output terminal (node C) of the inverter 14, and a source connected to GND. The capacitor 24 has the other end connected to the boosting circuit control terminal RE (switch control terminal EN).

The operation of the configuration example of the boosting circuit shown in FIG. 2 will next be described.

(1) When the boosting circuit 19 outputs a GND voltage:

The switch control terminal EN is inputted with a signal of a GND voltage in an inactive state. Further, a power supply voltage VDD of the internal circuit 15 is inputted to the power supply 26. Since the gate of the NMOS transistor 23 is at the VDD voltage and the source thereof is at the GND voltage, the NMOS transistor 23 is turned ON to bring the voltage output terminal RO (node D) of the boosting circuit 19 to GND. When the node E is at a voltage less than or equal to (VDD+|VGSP2|), the PMOS transistor 22 is turned OFF because the gate of the PMOS transistor 22 is at the VDD voltage and the source thereof is at less than or equal to (VDD+|VGSP2|). Here, VGSP2 is a threshold voltage of the PMOS transistor 22 (VGSP2<0). When the node E is at a voltage greater or equal to (VDD+|VGSP2|), the PMOS transistor 22 is turned ON until the source (node E) reaches the voltage of (VDD+|VGSP2|), to thereby discharge the capacitor 24. Since the anode of the diode 21 is at the VDD voltage when the node E is at a voltage less than or equal to (VDD−VBE), the diode 21 charges the capacitor 24 until the cathode (node E) thereof reaches the voltage of (VDD−VBE). Here, VBE is a threshold voltage of the diode 21 (VBE>0). When the node E is at a voltage greater than or equal to (VDD−VBE), the diode 21 does not allow current to flow. The capacitor 24 is charged/discharged according to the state of one end (node E) as described above and becomes a voltage at which the voltage of one end is greater than or equal to (VDD−VBE) and less than or equal to (VDD+VGSP2).

(2) When the boosting circuit 19 outputs a boosted voltage:

The switch control terminal EN is inputted with a signal of a VDD voltage in an active state. Since the gate of the NMOS transistor 23 is at the GND voltage, the NMOS transistor 23 is turned OFF. Since the capacitor 24 is inputted with the signal of the GND voltage at the other end thereof while the switch control terminal EN is in an inactive state, an electrical charge at which the inter-terminal voltage of the capacitor 24 assumes a voltage greater than or equal to (VDD−VBE) and less than or equal to (VDD+|VGSP2|) is accumulated between the terminals of the capacitor 24.

Since the voltage of the other end becomes the VDD voltage when the switch control terminal EN reaches the VDD voltage, the voltage of one end (node E) is boosted to greater than or equal to (2VDD−VBE) and less than or equal to (2VDD+|VGSP2|). Since the gate of the PMOS transistor 22 is at the GND voltage, the PMOS transistor 22 is turned ON. The electrical charge accumulated in the capacitor 24 is distributed to gate capacitances of the NMOS transistors 11 and 12 through the PMOS transistor 22. Thus, a voltage of the voltage output terminal RO (node D) is greater than or equal to (2VDD−VBE)*C1/(C1+CG) and less than or equal to (2VDD+|VGSP2|)*C1/(C1+CG). Here, C1 indicates the capacitance value of the capacitor 24, and CG indicates the sum of the capacitance values of the gate capacitances of the NMOS transistors 11 and 12. Now, when C1 is designed to be greater than or equal to CG*(VDD+VGSN1+VOVN1)/(VDD−VGSN1−VOVN1−VBE), the boosting circuit is capable of outputting a voltage greater than or equal to (VDD+VGSN1+VOVN1). Further, when C1 is designed to be less than or equal to CG*VBD1/(VDD−VGSN1−VOVN1−VBE), the NMOS transistors 11 and 12 are not broken down. Here, VBD1 is the gate breakdown voltage of the NMOS transistors 11 and 12.

Since a PMOS the source and backgate of which are connected to a power supply or a node such as an input/output terminal into which a large current is made to flow does not exist if the boosting circuit described above is provided, the risk of latch-up is low. Further, a circuit scale is also small and the cost is low as well.

Second Embodiment

Figure 3:
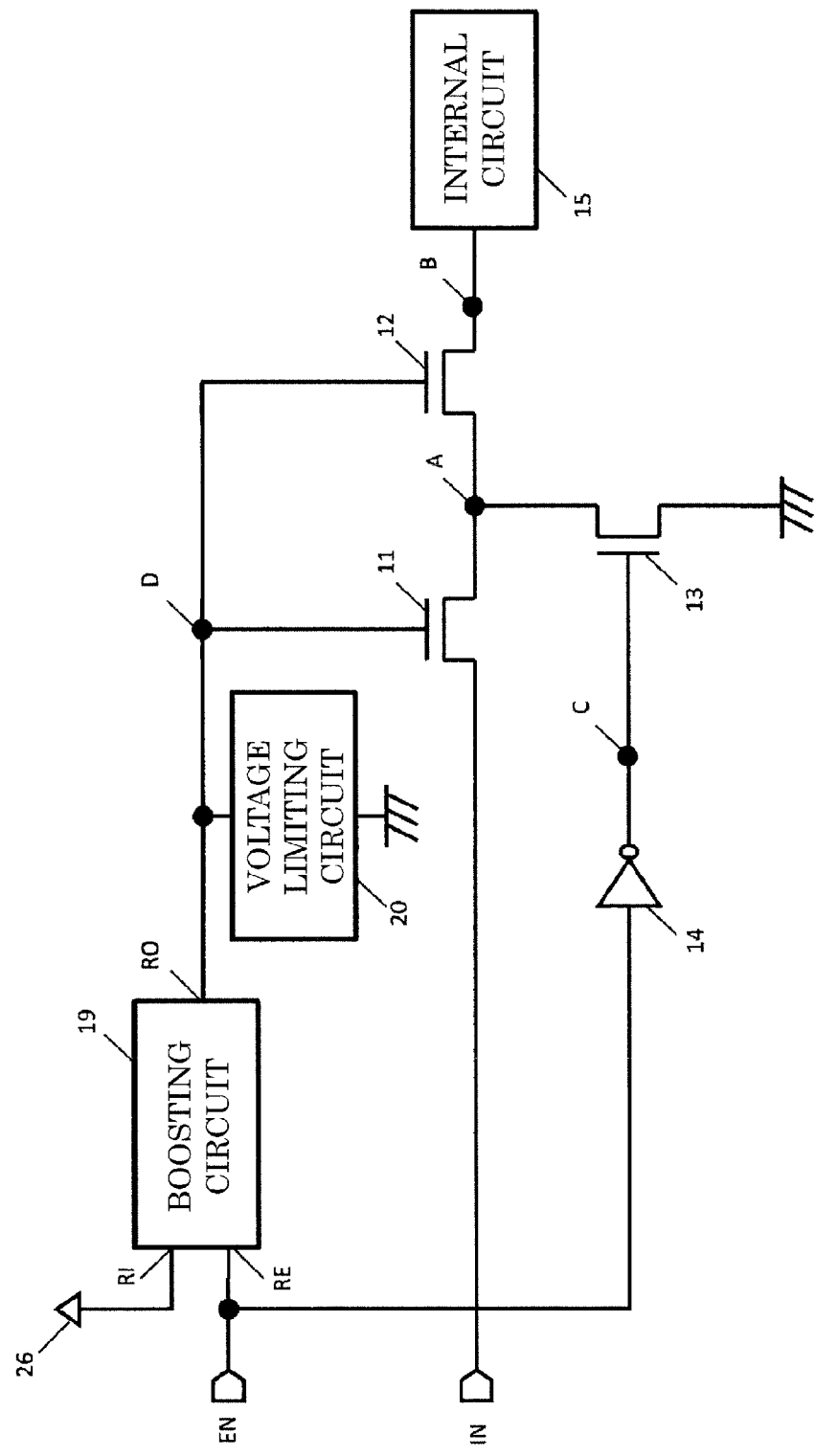
FIG. 3 is a circuit diagram illustrating a switch circuit according to a second embodiment.
Figure 4:
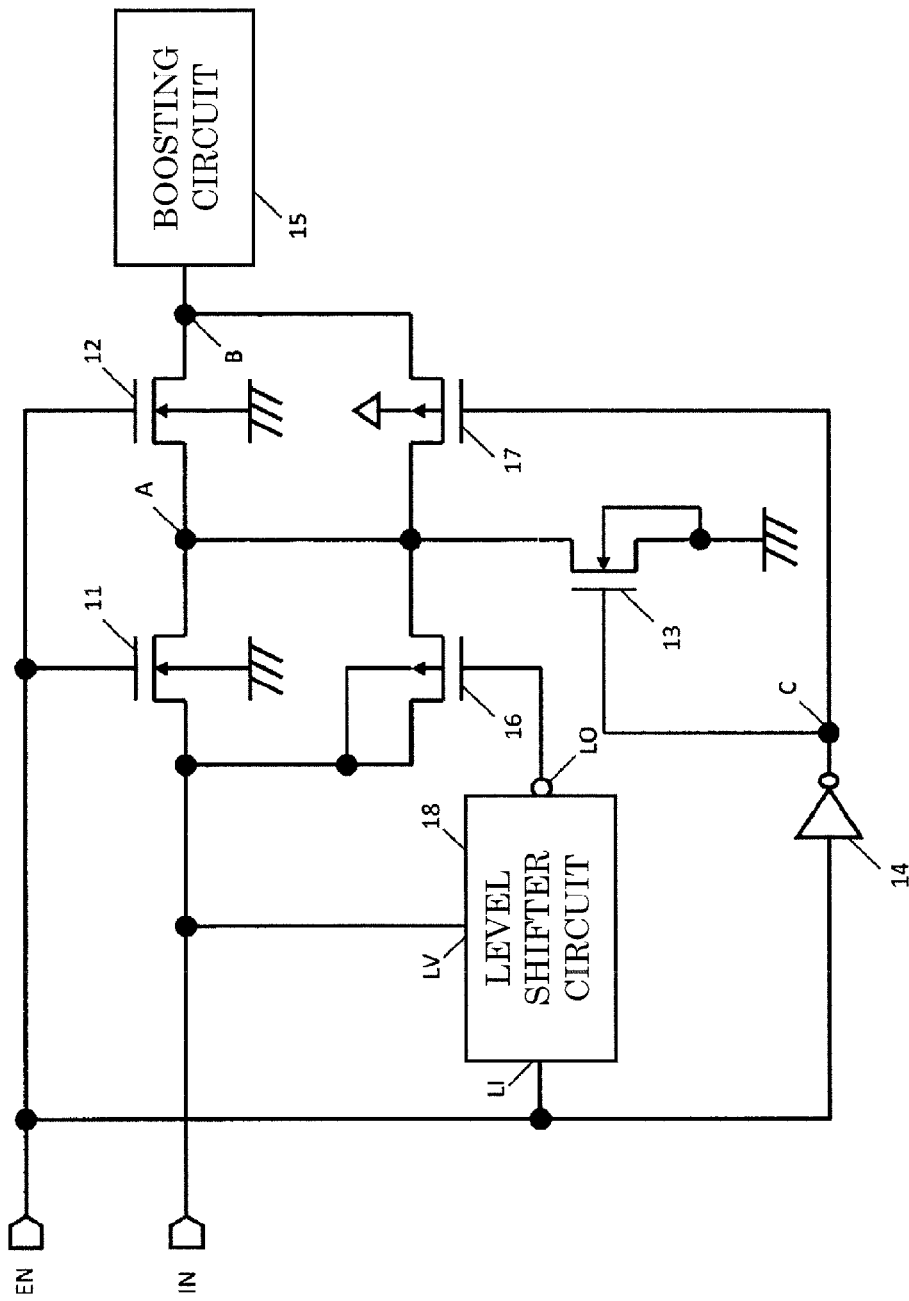
FIG. 4 is a circuit diagram illustrating a related art switch circuit.

FIG. 3 is a circuit diagram illustrating a switch circuit according to a second embodiment.

The switch circuit according to the second embodiment is equipped with a voltage limiting circuit 20 in addition to the switch circuit according to the first embodiment. The voltage limiting circuit 20 has one end connected to the voltage output terminal RO (node D) of the boosting circuit 19, and the other end connected to GND.

The voltage limiting circuit 20 allows current to flow into GND when the voltage output terminal RO of the boosting circuit 19 is at greater than equal to a voltage VBD2, to thereby maintain the voltage at less than or equal to VBD2. Here, VBD2 is a voltage greater than or equal to (VDD+VGSN1+VOVN1) and a voltage lower than the gate breakdown voltage of the NMOS transistors 11 and 12.

Thus, in the switch circuit according to the second embodiment, even when the output voltage of the boosting circuit 19 becomes the voltage greater than or equal to the gate breakdown voltage of the NMOS transistors 11 and 12 for some reason, the NMOS transistors 11 and 12 can be prevented from being broken down, and other circuit operations are similar to the circuit operation described in the first embodiment.

What is claimed is:

1. A switch circuit provided at an input terminal of a semiconductor device, which is inputted with a positive or negative voltage, and controlling whether to transmit the positive or negative voltage to an internal circuit or shut off the positive or negative voltage, said switch circuit comprising:

a first NMOS transistor having a drain connected to the input terminal of the semiconductor device, a source connected to a first node, and a gate connected to a second node;

a second NMOS transistor having a drain connected to the first node, a source connected to a third node, and a gate connected to the second node;

a third NMOS transistor having a source connected to a ground voltage, a drain connected to the first node, a gate connected to a switch control terminal via an inverter; and a boosting circuit having a boosting circuit control terminal connected to the switch control terminal, a voltage input terminal connected to a power supply, and a voltage output terminal connected to the second node, wherein the boosting circuit comprises:

a rectifying element having an anode connected to the voltage input terminal and a cathode connected to a fourth node, a PMOS transistor having a drain connected to the voltage output terminal, a gate connected to the switch control terminal via the inverter, and source connected to the fourth node, a fourth NMOS transistor having a drain connected to the voltage output terminal, a gate connected to the switch control terminal via the inverter, and a source connected to the ground voltage, and a capacitor having one end connected to the fourth node and the other end connected to the boosting circuit control terminal;

wherein the third node is connected to the internal circuit.

2. The switch circuit according to claim 1, including a voltage limiting circuit having one end connected to the second node and the other end connected to the ground voltage.

* * * * *